(12) United States Patent
Zang et al.

(10) Patent No.: US 10,727,067 B2
(45) Date of Patent: Jul. 28, 2020

(54) LATE GATE CUT USING SELECTIVE CONDUCTOR DEPOSITION

(71) Applicant: GLOBALFOUNDRIES Inc., Grand Cayman (KY)

(72) Inventors: Hui Zang, Guilderland, NY (US); David P. Brunco, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/203,816

(22) Filed: Nov. 29, 2018

(65) Prior Publication Data
US 2020/0176258 A1 Jun. 4, 2020

(51) Int. Cl.
| | |
|---|---|
| *H01L 21/28* | (2006.01) |
| *H01L 21/8234* | (2006.01) |
| *H01L 29/06* | (2006.01) |
| *H01L 21/3213* | (2006.01) |
| *H01L 27/088* | (2006.01) |
| *H01L 29/49* | (2006.01) |

(52) U.S. Cl.
CPC .. *H01L 21/28123* (2013.01); *H01L 21/32133* (2013.01); *H01L 21/823431* (2013.01); *H01L 21/823437* (2013.01); *H01L 21/823481* (2013.01); *H01L 27/0886* (2013.01); *H01L 29/0649* (2013.01); *H01L 29/4983* (2013.01)

(58) Field of Classification Search
CPC ....... H01L 21/28123; H01L 21/823481; H01L 21/823431; H01L 21/32133; H01L 21/823437; H01L 27/0886; H01L 29/0649; H01L 29/4983

See application file for complete search history.

(56) References Cited

U.S. PATENT DOCUMENTS

| | | | |
|---|---|---|---|
| 2015/0008488 A1* | 1/2015 | Hall | H01L 29/66636 257/288 |
| 2015/0340461 A1 | 11/2015 | Wei et al. | |
| 2017/0148682 A1* | 5/2017 | Basker | H01L 21/823431 |
| 2018/0182859 A1 | 6/2018 | Lee et al. | |
| 2018/0308949 A1* | 10/2018 | Lin | H01L 21/823481 |
| 2019/0371674 A1* | 12/2019 | Wu | H01L 21/823431 |

* cited by examiner

*Primary Examiner* — Sitaramarao S Yechuri
(74) *Attorney, Agent, or Firm* — Thompson Hine LLP; Francois Pagette

(57) ABSTRACT

Methods of forming a structure that includes a field-effect transistor and structures that include a field effect-transistor. A cut is formed that extends through a gate structure of the field-effect transistor such that a gate electrode of the gate structure is divided into a first section having a first surface and a second section having a second surface spaced across the cut from the first surface. After forming the cut, a first section of a conductive layer is selectively deposited on the first surface of the first section of the gate electrode and a second section of the conductive layer is selectively deposited on the second surface of the second section of the gate electrode to shorten the cut. A dielectric material is deposited in the cut between the first and second sections of the conductive layer on the first and second surfaces of the gate electrode to form a dielectric pillar.

17 Claims, 6 Drawing Sheets

LATE GATE CUT USING SELECTIVE CONDUCTOR DEPOSITION

BACKGROUND

The present invention relates to semiconductor device fabrication and integrated circuits and, more specifically, to structures that include a field effect-transistor and methods of forming a structure that includes a field-effect transistor.

Complementary-metal-oxide-semiconductor (CMOS) processes may be used to build a combination of p-type and n-type field-effect transistors that are used to construct, for example, logic cells. Field-effect transistors generally include a body providing a channel region, a source, a drain, and a gate electrode. When a control voltage exceeding a characteristic threshold voltage is applied to the gate electrode, carrier flow occurs in the channel region between the source and drain to produce a device output current.

A fin-type field-effect transistor (FinFET) is a non-planar device structure that may be more densely packed in an integrated circuit than planar field-effect transistors. A fin-type field-effect transistor may include a fin consisting of a body of semiconductor material, a gate structure that wraps about the fin, and heavily-doped source/drain regions spaced along the fin and arranged on opposite sides of the gate structure.

Gate structures may be initially formed as linear features that extend longitudinally across fins of fin-type field-effect transistors that are associated with different active device regions. After forming the gate structures, a masked etching process may be used to form cuts that divide the gate structures into sections that are associated with one active device region and sections that are associated with another active device region. The sections of the gate structures associated with the different active device regions are disconnected from each other in the final construction of the fin-type field-effect transistors in the different active device regions.

As fin pitch scales downward, providing a precision gate cut at locations between different device regions presents challenges with respect to process margin. Gate cuts at small dimensions may be incompletely formed, which may result in sections of the gate structures that are not fully disconnected. To resolve this issue, the etching process forming the gate cuts may be extended to provide an over-etch. However, the over-etch may unwantedly increase the dimensions of the gate cuts such that, among other effects, the gate contacts may land in part on the dielectric material filling the gate cuts.

Improved structures that include a field effect-transistor and methods of forming a structure that includes a field-effect transistor are needed.

SUMMARY

In an embodiment of the invention, a method includes forming a gate structure that includes a gate electrode, and forming a cut extending through the gate structure such that the gate electrode is divided into a first section having a first surface and a second section having a second surface spaced across the cut from the first surface. The method further includes, after forming the cut, selectively depositing a first section of a conductive layer on the first surface of the first section of the gate electrode and a second section of the conductive layer on the second surface of the second section of the gate electrode to shorten the cut. A dielectric material is deposited in the cut between the first section of the conductive layer on the first surface of the gate electrode and the second section of the conductive layer on the second surface of the gate electrode to form a dielectric pillar.

In an embodiment of the invention, a structure includes a gate structure having a gate electrode with a first section and a second section disconnected from the first section by a cut, and a dielectric cap having a first section arranged over the first section of the gate electrode and a second section arranged over the second section of the gate electrode. A dielectric pillar has a first portion arranged in the cut between the first section and the second section of the gate electrode and a second portion arranged between the first section and the second section of the dielectric cap. The second portion of the dielectric pillar has a length that is greater than a length of the first portion of the dielectric pillar.

In an embodiment of the invention, a structure includes a gate structure having a gate electrode with a first section with a first surface and a second section with a second surface disconnected from the first surface by a cut, and a conductive layer having a first section arranged on the first surface of the first section of the gate electrode and a second section arranged on the second surface of the second section of the gate electrode. A dielectric pillar is arranged in the cut between the first section of the conductive layer and the second section of the conductive layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
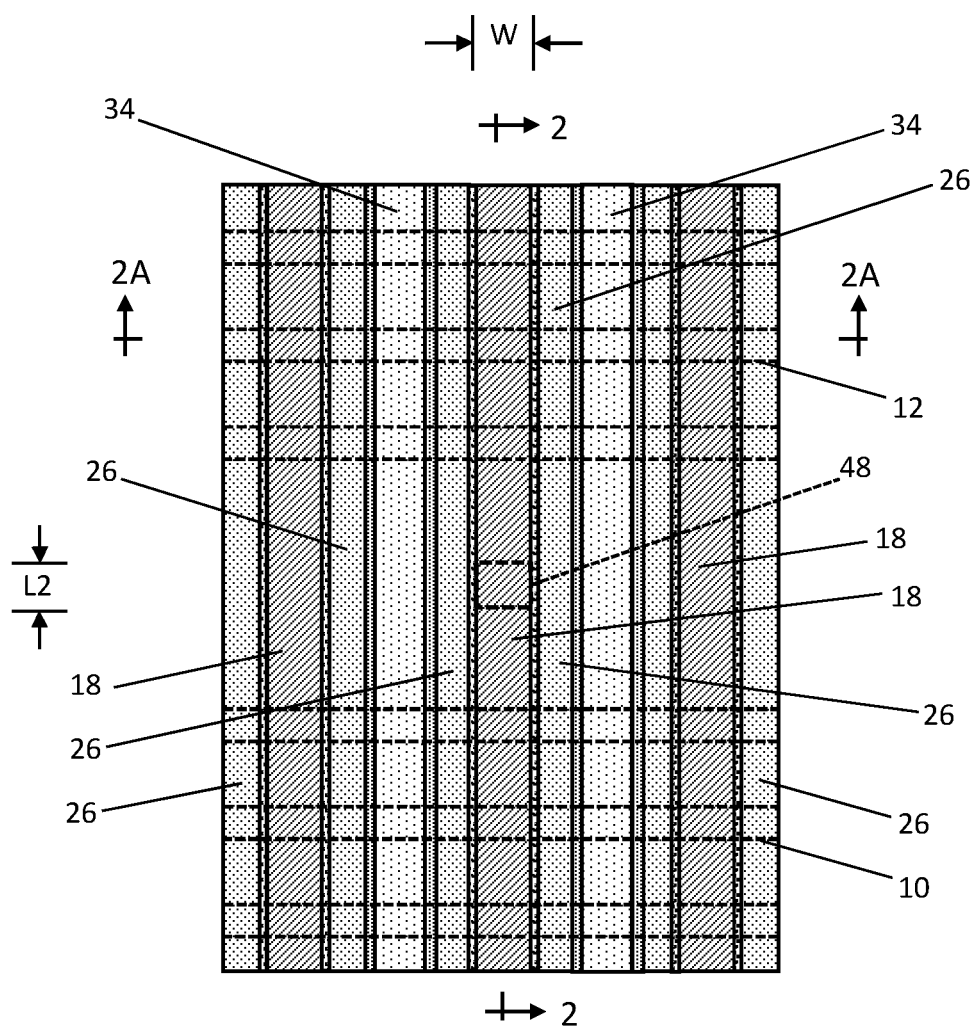
FIG. 1 is a top view of a structure at an initial fabrication stage of a processing method in accordance with embodiments of the invention.
Figure 2:
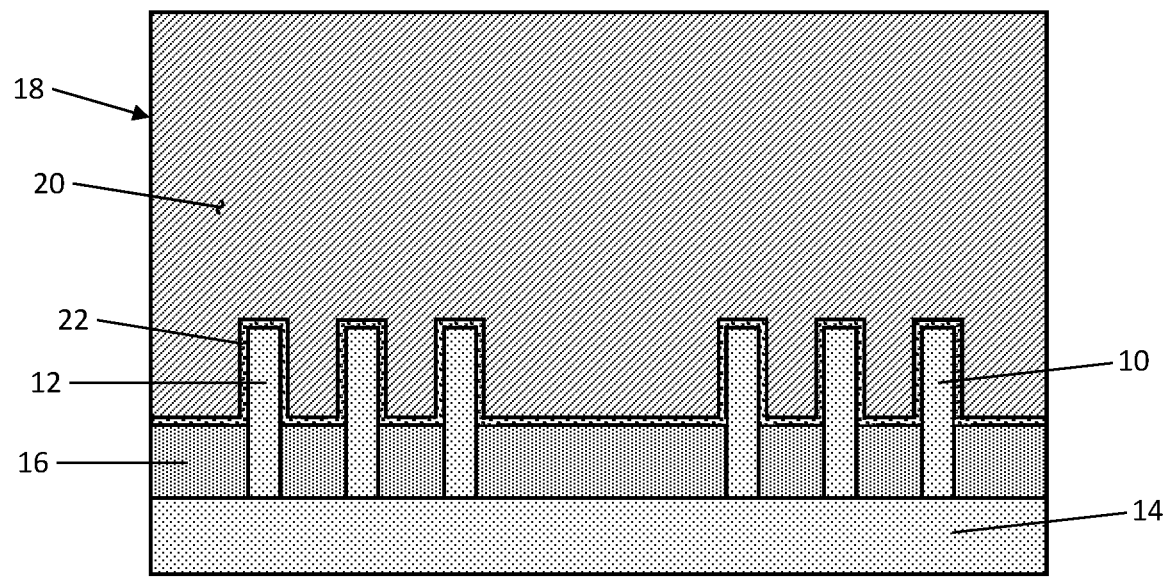
FIG. 2 is a cross-sectional view taken generally along line 2-2 in FIG. 1.
Figure 2A:
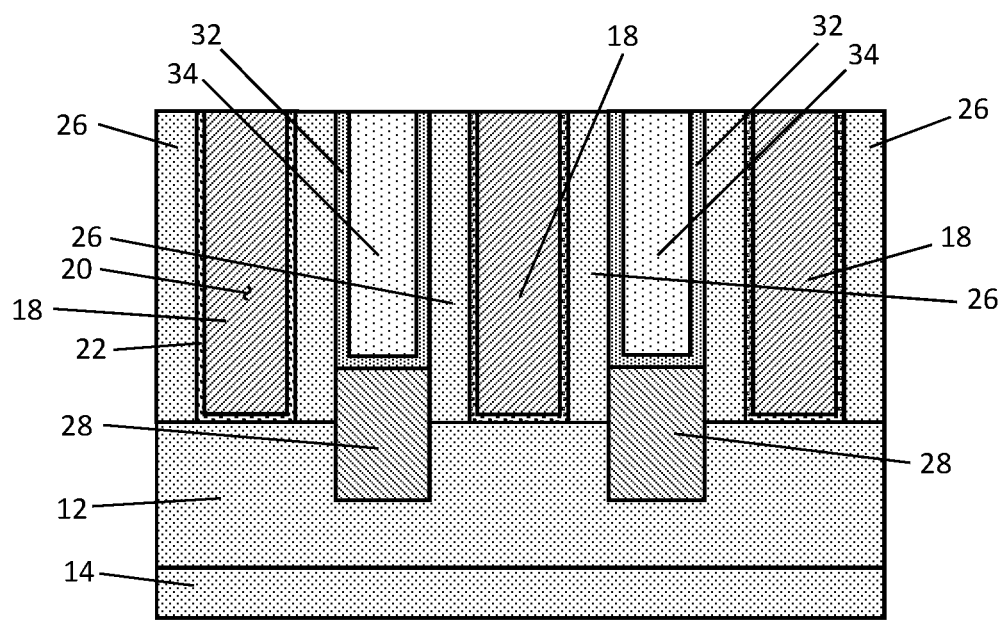
FIG. 2A is a cross-sectional view taken generally along line 2A-2A in FIG. 1.

With reference to FIGS. 1, 2, and 2A and in accordance with embodiments of the invention, fins 10, 12 of an integrated circuit structure are formed that project from a substrate 14. The fins 10, 12 may be formed by patterning the single-crystal semiconductor material (e.g., single-crystal silicon) of the substrate 14 with lithography and etching processes, and cutting the patterning semiconductor material into given lengths in the layout associated with the specific device structures being formed and their arrangement. Trench isolation regions 16 are formed that operate to electrically isolate the fins 10, 12 from each other. The trench isolation regions 16 may be formed by depositing a layer composed of a dielectric material, such as an oxide of silicon (e.g., silicon dioxide), by chemical vapor deposition (CVD), and recessing with an etching process. An upper section of each of the fins 10, 12 is revealed by the recessing of the trench isolation regions 16, and a lower section of each of the fins 10, 12 is surrounded by the trench isolation regions 16.

Gate structures 18 of the integrated circuit structure are formed that extend along respective longitudinal axes over the fins 10, 12 and trench isolation regions 16. Each gate structure 18 is arranged transverse to the fins 10 and overlaps with a section of each fin 10. Each gate structure 18 is also arranged transverse to the fins 12 and overlaps with a section of each fin 12. Each gate structure 18 may include a gate electrode 20 and a gate dielectric layer 22 arranged between the overlapped sections of the fins 10, 12 and the gate electrode 20. The gate electrode 20 may include one or more conformal barrier metal layers and/or work function metal layers, such as metal layers composed of titanium aluminum carbide and/or titanium nitride, and/or a metal gate fill layer composed of a conductor, such as tungsten, cobalt, or aluminum. The gate dielectric layer 22 may be composed of a high-k dielectric material, such as hafnium oxide. Each gate electrode 20 has a width, W, in a direction transverse to its longitudinal axis (i.e., its length). The intended location for a cut 48, which is formed by subsequent fabrication stages, in the gate electrode 20 of one of the gate structures 18 is diagrammatically shown in FIG. 1.

Sidewall spacers 26 are arranged on the opposite sidewalls of the gate structures 18. The sidewall spacers 26 may be composed of a low-k dielectric material that is deposited with atomic layer deposition (ALD) as a conformal layer on the gate structures 18 and etched with a directional etching process, such as reactive ion etching (RIE).

Semiconductor layers 28 are epitaxially grown from the fins 10, 12. The semiconductor layers 28 may be formed by an epitaxial growth process in which semiconductor material epitaxially grows from a semiconductor surface, such as the exposed surfaces of fins 10, 12. The epitaxial semiconductor layers 28 associated with fins 10 may contain silicon-germanium doped during epitaxial growth with a p-type dopant (e.g., boron, aluminum, gallium, and/or indium) that provides p-type electrical conductivity, and the epitaxial semiconductor layers 28 associated with fins 12 may contain silicon doped during epitaxial growth with an n-type dopant (e.g., phosphorus and/or arsenic) that provides n-type electrical conductivity. The epitaxial semiconductor layers 28 furnish source/drain regions for field-effect transistors formed using the fins 10, 12 and gate structures 18, and provide enlarged landing areas for contacts. As used herein, the term "source/drain region" means a doped region of semiconductor material that can function as either a source or a drain of a field-effect transistor.

A conformal contact etch stop layer (CESL) 32 and an interlayer dielectric layer 34 are formed in the spaces over the epitaxial semiconductor layers 28. The CESL 32 provides a liner arranged over the epitaxial semiconductor layers 28 and between the sidewall spacers 26 and the sections of interlayer dielectric layer 34. The CESL 32 may be composed of a thin layer of a dielectric material, such as silicon nitride, deposited by atomic layer deposition. The interlayer dielectric layer 34 may be composed of a dielectric material, such as silicon dioxide, that is deposited by chemical vapor deposition and planarized, and that differs in composition from the dielectric material of the sidewall spacers 26.

Figure 3:
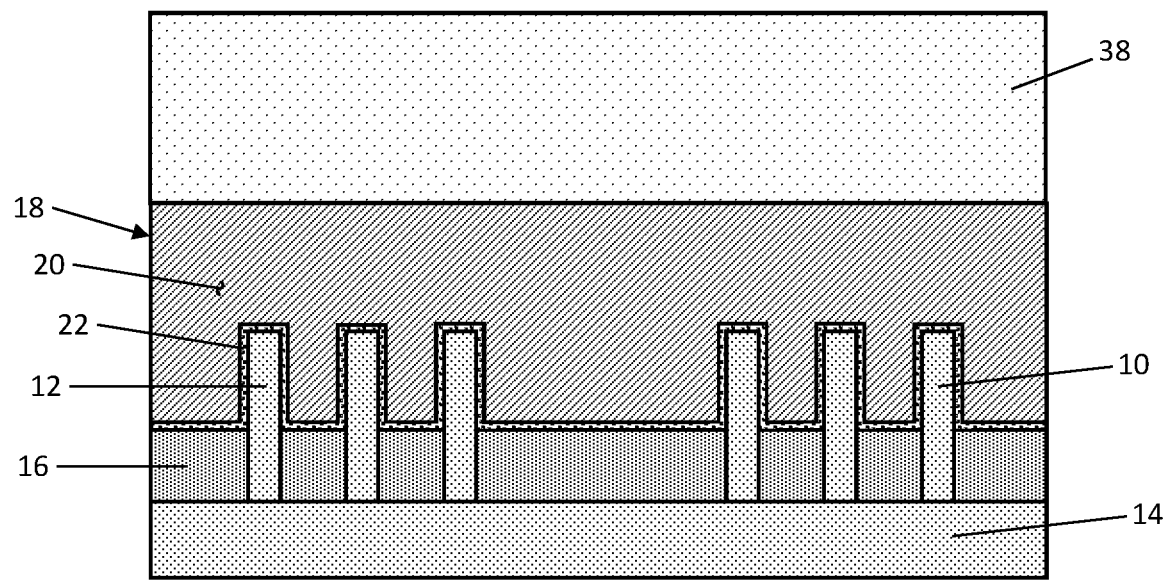
FIG. 3 is cross-sectional view of the structure at a fabrication stage of the processing method subsequent to FIG. 2.
Figure 3A:
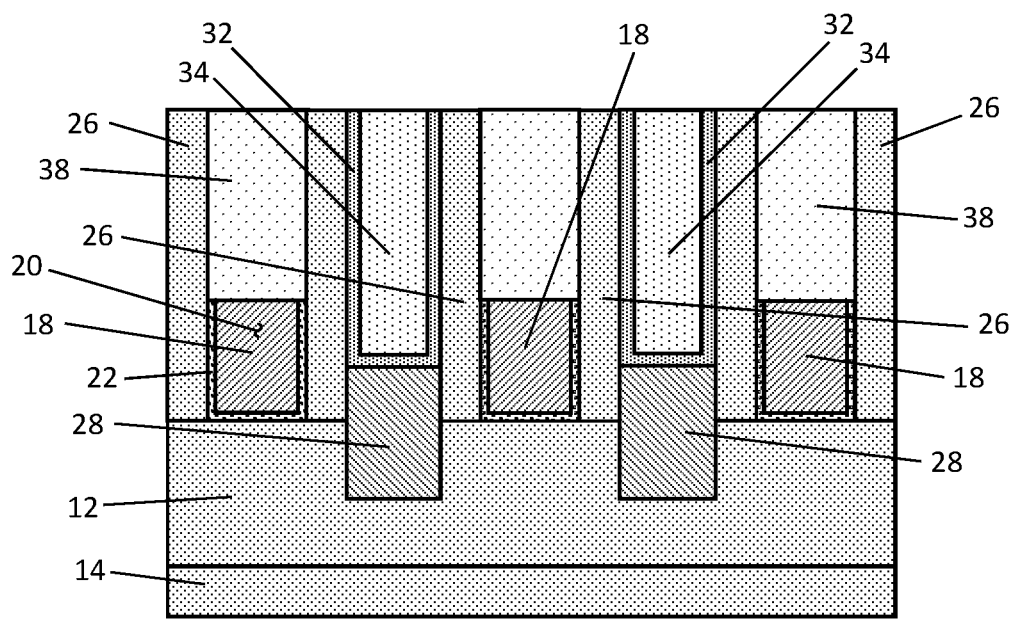
FIG. 3A is cross-sectional view of the structure at a fabrication stage of the processing method subsequent to FIG. 2A.

With reference to FIGS. 3, 3A in which like reference numerals refer to like features in FIGS. 2, 2A and at a subsequent fabrication stage of the processing method, the gate electrode 20 and the gate dielectric layer 22 of the gate structures 18 are recessed relative to the sidewall spacers 26, the CESL 32, and the interlayer dielectric layer 34 using one or more selective etching processes to form cavities. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Portions of the sidewall spacers 26 project above the top surface of the recessed gate structures 18, and the cavities are arranged over the recess gate structures 18 between the sidewall spacers 26.

After the gate structures 18 are recessed, self-aligned contact caps 38 are formed as dielectric caps in the cavities over the gate structures 18 and between the portions of the sidewall spacers 26 arranged over the gate structures 18. The self-aligned contact caps 38 may be composed of a layer of a dielectric material, such as silicon nitride, that is deposited by chemical vapor deposition and then planarized with chemical-mechanical polishing (CMP).

Figure 4:
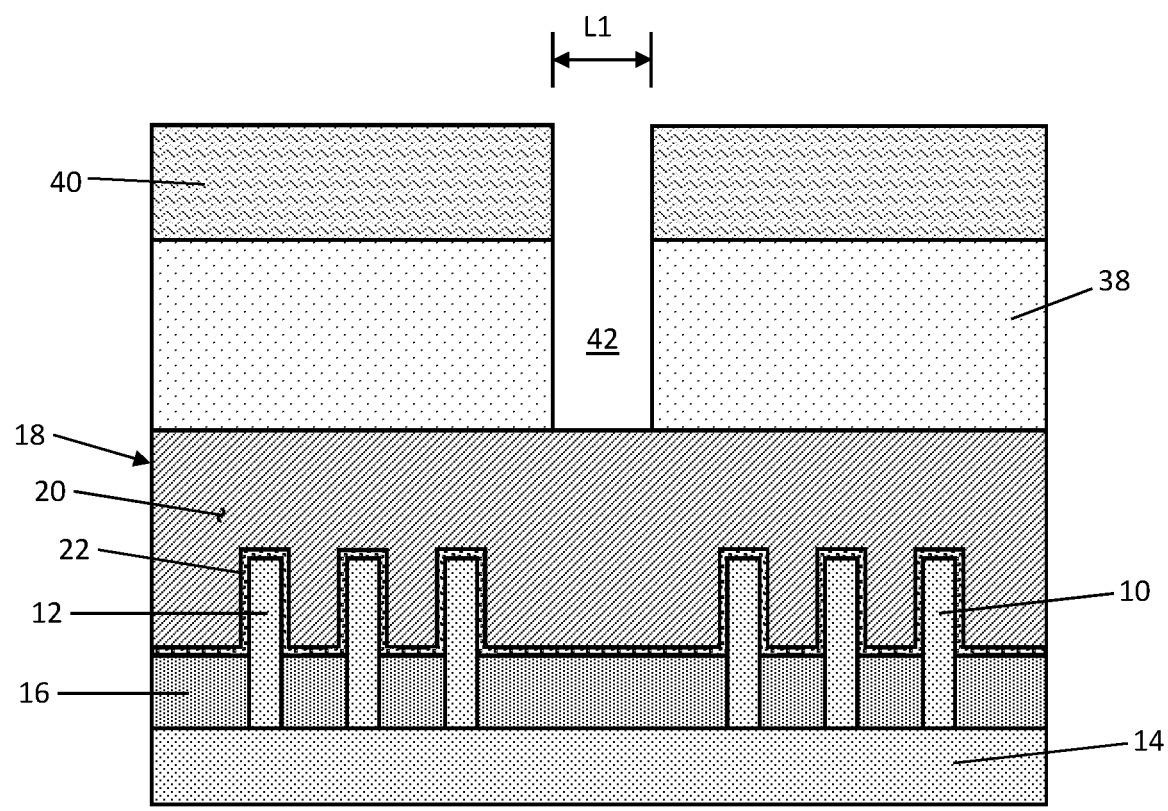
FIG. 4-7 are cross-sectional views of the structure at successive fabrication stages of the processing method subsequent to FIG. 3.

With reference to FIG. 4 in which like reference numerals refer to like features in FIG. 3 and at a subsequent fabrication stage of the processing method, a hardmask 40 is formed over the self-aligned contact cap 38 by depositing a layer of material and patterning the material of the deposited layer with lithography and etching processes to generate an opening 42. The hardmask 40 may be composed of a material, such as titanium oxide, that can be removed by an etching process selective to the material of the self-aligned contact caps 38. The opening 42 in the hardmask 40 exposes a portion of the self-aligned contact cap 38 over one of the gate structures 18. The exposed portion of the self-aligned contact cap 38 may be located in an area that is arranged in a lateral direction between the fins 10 and the fins 12.

The opening 42 in the hardmask 40 extends parallel to the longitudinal axis of the gate structure 18 and has a length, L1, that is significantly less than the length of the gate structure 18. The opening 42 opening 42 may overlap at its side edges with the sidewall spacers 26 and adjacent sections of the interlayer dielectric layer 34.

The opening 42 is transferred from the hardmask 40 to the self-aligned contact cap 38. Specifically, the portion of the self-aligned contact cap 38 exposed by the opening 42 in the hardmask 40 is etched and removed with an etching process, such as a reactive ion etching process, to extend the opening 42 into the self-aligned contact cap 38. The opening 42 in the self-aligned contact cap 38 exposes a lengthwise portion of the gate structure 18 having an area that is equal or substantially equal to the cross-sectional area of the opening 42. The opening 42 divides the self-aligned contact cap 38 into disconnected sections that face each other across the opening 42 and that are separated by the length, L1.

Figure 5:
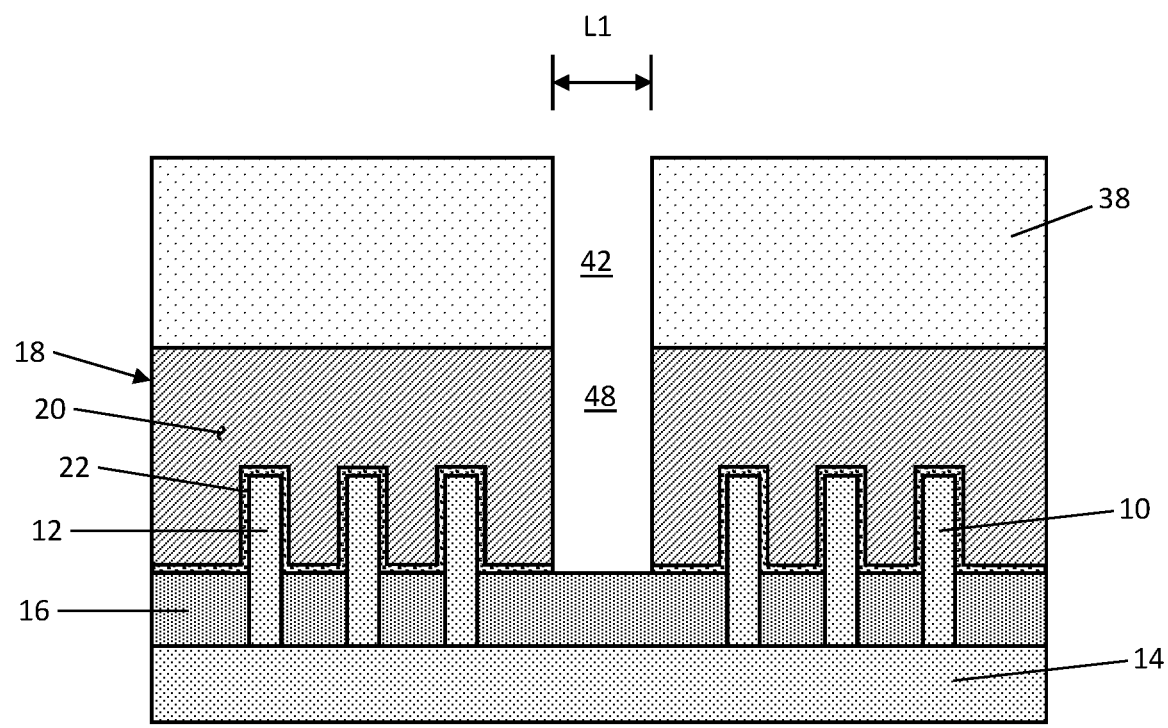

With reference to FIG. 5 in which like reference numerals refer to like features in FIG. 4 and at a subsequent fabrication stage of the processing method, the hardmask 40 is removed from the self-aligned contact cap 38 by an etching process that stops on the self-aligned contact cap 38. The etching process removes the hardmask 40 selective to the self-aligned contact cap 38. The exposed portions of the gate electrode 20 and the gate dielectric layer 22 are then removed by one or more etching processes, such as one or more reactive ion etching processes, to define a cut 48 in the gate structure 18. The one or more etching processes may stop on the trench isolation region 16. The cut 48 may penetrate fully through the thickness or height of the gate structure 18 to the top surface of the trench isolation region 16 and fully across the width of the gate electrode 20 such that the gate electrode 20 is divided into individual disconnected sections that are arranged along a common longitudinal axis.

The cut 48 introduces a discontinuity in the gate structure 18 that provides the disconnected sections of the associated gate electrode 20. Each section of the gate electrode 20 includes a surface 50 that borders the opposite sidewalls of the cut 48. One of the sections of the gate electrode 20 may be associated with the fins 10, and the other of the sections of the gate electrode 20 may be associated with the fins 12. The cut 48 initially has a length equal or substantially equal to the length, L1, of the opening 42 in the hardmask 40 and a width in a direction that is transverse to the length. The width of the cut 48 optionally includes the thickness of the gate dielectric layer 22.

Figure 6:
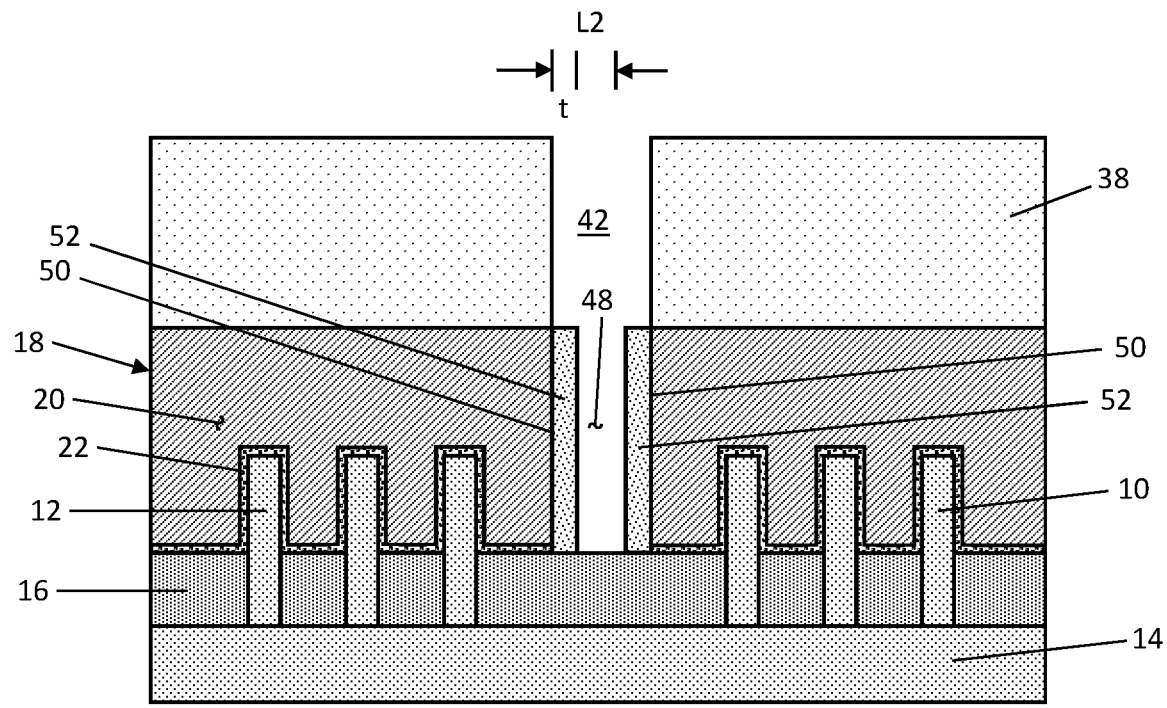

With reference to FIG. 6 in which like reference numerals refer to like features in FIG. 5 and at a subsequent fabrication stage of the processing method, a conductive layer 52 is formed on the surfaces 50 of the disconnected sections of the gate electrode 20 bordering the opposite sides of the cut 48. The conductive layer 52 may be composed of a conductor, such as a metal like tungsten, cobalt, aluminum, or copper, and each conductive layer 52 may have a given thickness, t, measured normal to the surface 50 on which it is formed. The conductive layer 52 is selectively deposited on each surface 50 by a deposition processes, such as chemical vapor deposition or electroplating, that forms the metal on the surfaces 50 without forming the metal on exposed dielectric surfaces, such as the exposed surfaces of the self-aligned contact cap 38 bordering the cut 48 and the exposed surface of the trench isolation region 16 at the base of the cut 48. The conductive layer 52 shortens the length of the cut 48 such that the cut 48 has a length, L2, that is less than the initial length, L1 (FIG. 5). The width of the cut 48 is unchanged by the addition of the conductive layer 52 on each of the surfaces 50. In an embodiment, the sections of the conductive layer 52 may deposit with equal or substantially equal thickness on the respective surfaces 50 and thereby shorten the length of the cut 48 by an amount equal to two times the thickness, t, of the conductive layer 52.

Figure 7:
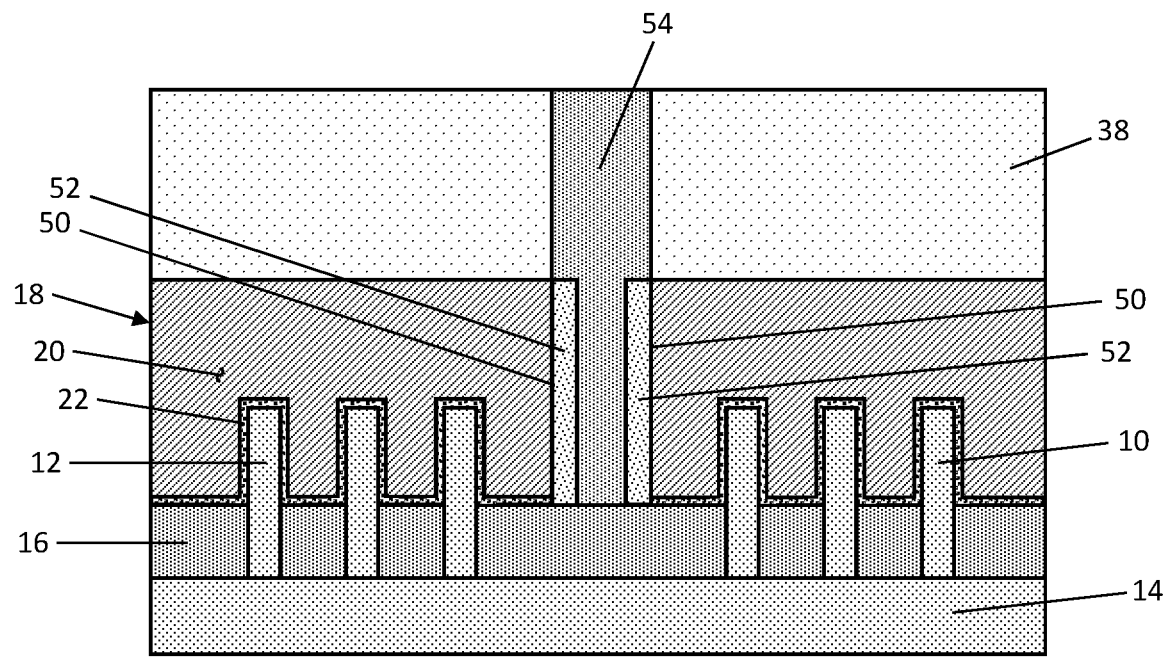

With reference to FIG. 7 in which like reference numerals refer to like features in FIG. 6 and at a subsequent fabrication stage of the processing method, a dielectric pillar 54 is formed in the shortened cut 48 between the sections of the conductive layer 52 on the surfaces 50 of the sections of the gate electrode 20 and in the opening 42 between the sections of the self-aligned contact cap 38, and planarized with chemical-mechanical polishing (CMP). In an embodiment, the dielectric pillar 54 may be composed of a dielectric material, such as silicon nitride, deposited by chemical vapor deposition or atomic layer deposition. In an embodiment, the dielectric material of the dielectric pillar 54 may have a different composition than the dielectric material of the self-aligned contact cap 38. In an embodiment, the dielectric pillar 54 may be composed of a dielectric material characterized by a dielectric constant that is less than the dielectric constant of silicon nitride (i.e., a low-k dielectric material), such as SiC, SiOC, SiOCN, or SiBCN, deposited by chemical vapor deposition or atomic layer deposition.

A lower portion of the dielectric pillar 54 is arranged in the cut 48 and has a length equal or substantially equal to the length, L2, of the cut 48, which is shortened by the addition of the sections of the conductive layer 52 on each surface 50 of the different sections of the gate electrode 20. An upper portion of the dielectric pillar 54 is arranged in the opening 42 in the self-aligned contact cap 38 and has a length equal or substantially equal to the length, L1, of the opening 42. The result is that the dielectric pillar 54 has dual lengths with the shorter lower portion arranged inside the gate electrode 20 and the longer upper portion arranged inside the self-aligned contact cap 38. The lower portion of the dielectric pillar 54 electrically and physically isolates the different sections of the gate electrode 20 of the gate structure 18 from each other.

The dielectric pillar 54 is formed in a self-aligned manner in the cut 48 between the sections of the gate electrode 20 and in the opening 42 in the self-aligned contact cap 38. The selective deposition of the conductive layer 52 on the surfaces 50 of the gate electrode 20 permits the cut 48 to be readily shortened to provide cut scaling in a metal-gate-cut-last process flow. The cut 48 may be provided with small dimensions and completely formed without the need for an over-etch.

After forming and filling the cut 48 with dielectric material, middle-of-line processing may be performed to form contacts connected with the gate electrodes 20 of the gate structures 18 and the epitaxial semiconductor layers 28 providing the source/drain regions.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a gate structure including a gate electrode having one or more metal layers;
   forming a cut extending through the gate structure such that the gate electrode is divided into a first section having a first surface and a second section having a second surface spaced across the cut from the first surface;
   after forming the cut, selectively depositing a first section of a conductive layer on the first surface of the first section of the gate electrode and a second section of the conductive layer on the second surface of the second section of the gate electrode to shorten the cut; and
   depositing a first dielectric material in the cut between the first section of the conductive layer on the first surface of the gate electrode and the second section of the conductive layer on the second surface of the gate electrode to form a dielectric pillar.

2. The method of claim 1 further comprising:
   before forming the cut, forming a dielectric cap over the gate structure; and
   patterning the dielectric cap to form an opening extending through the dielectric cap to the gate electrode of the gate structure.

3. The method of claim 2 wherein the cut is formed beneath the opening in the dielectric cap by an etching process.

4. The method of claim 3 wherein the opening has a first length, and the cut has a second length that is substantially equal to the first length before selectively depositing the first section of the conductive layer on the first surface of the first section of the gate electrode and the second section of the conductive layer on the second surface of the second section of the gate electrode.

5. The method of claim 3 wherein the opening has a first length, and the cut has a second length that is less than the first length after selectively depositing the first section of the conductive layer on the first surface of the first section of the gate electrode and the second section of the conductive layer on the second surface of the second section of the gate electrode.

6. The method of claim 2 wherein the dielectric cap includes a first section arranged over the first section of the gate electrode and a second section arranged over the second section of the gate electrode, and the first section of the dielectric cap and the second section of the dielectric cap are disconnected by the opening.

7. The method of claim 6 wherein the conductive layer is selectively deposited on the first surface of the first section of the gate electrode and on the second surface of the second section of the gate electrode without depositing within the opening on the first section and the second section of the dielectric cap.

8. The method of claim 2 wherein the first dielectric material is a low-k dielectric material, and the dielectric cap is comprised of a second dielectric material having a different composition than the first dielectric material.

9. The method of claim 1 wherein the conductive layer has a first thickness on the first surface of the first section of the gate electrode and a second thickness on the second surface of the second section of the gate electrode, and the first thickness is substantially equal to the second thickness.

10. The method of claim 1 wherein the conductive layer is comprised of a first metal, and the gate electrode is comprised of a second metal having a different composition than the first metal.

11. The method of claim 1 wherein the first section of the gate electrode is disconnected from the second section of the gate electrode.

12. A structure comprising:
    a gate structure including a gate electrode with a first section and a second section disconnected from the first section by a cut, the first section and the second section of the gate electrode each including one or more metal layers;
    a dielectric cap including a first section arranged over the first section of the gate electrode and a second section arranged over the second section of the gate electrode; and
    a dielectric pillar having a first portion arranged in the cut between the first section and the second section of the gate electrode and a second portion arranged between the first section and the second section of the dielectric cap, the first portion of the dielectric pillar having a first length, and the second portion of the dielectric pillar having a second length that is greater than the first length.

13. The structure of claim 12 wherein the dielectric pillar is comprised of a first dielectric material, and the dielectric cap is comprised of a second dielectric material having a different composition than the first dielectric material.

14. The structure of claim 13 wherein the first dielectric material is a low-k dielectric material.

15. The structure of claim 12 wherein the first section of the gate electrode has a first surface and the second section of the gate electrode has a second surface, further comprising:
    a conductive layer having a first section arranged on the first surface and a second section arranged on the second surface.

16. The structure of claim 15 wherein the conductive layer has a first thickness on the first surface of the gate electrode and a second thickness on the second surface of the gate electrode, and the first thickness is substantially equal to the second thickness.

17. The structure of claim 15 wherein the conductive layer is comprised of a first metal, and the gate electrode is comprised of a second metal having a different composition than the first metal.

* * * * *